(12) United States Patent
Oxland et al.

(10) Patent No.: US 9,685,514 B2
(45) Date of Patent: Jun. 20, 2017

(54) III-V COMPOUND SEMICONDUCTOR DEVICE HAVING DOPANT LAYER AND METHOD OF MAKING THE SAME

(71) Applicant: Taiwan Semiconductor Manufacturing Co., Ltd., Hsin-Chu (TW)

(72) Inventors: Richard Kenneth Oxland, Leuven (BE); Mark van Dal, Heverlee (BE)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/926,077

(22) Filed: Oct. 29, 2015

(65) Prior Publication Data

US 2016/0049477 A1 Feb. 18, 2016

Related U.S. Application Data

(62) Division of application No. 13/467,133, filed on May 9, 2012, now abandoned.

(51) Int. Cl.
*H01L 29/207* (2006.01)
*H01L 21/02* (2006.01)
(Continued)

(52) U.S. Cl.
CPC ...... *H01L 29/207* (2013.01); *H01L 21/02538* (2013.01); *H01L 21/02546* (2013.01); *H01L 21/225* (2013.01); *H01L 21/2258* (2013.01); *H01L 21/30612* (2013.01); *H01L 21/31* (2013.01); *H01L 21/3245* (2013.01); *H01L 29/0847* (2013.01); *H01L 29/205* (2013.01); *H01L 29/6656* (2013.01); *H01L 29/66522* (2013.01); *H01L 29/7834* (2013.01)

(58) Field of Classification Search
CPC ............... H01L 29/207; H01L 21/2258; H01L 21/02538
USPC .................................................. 257/288, 615
See application file for complete search history.

(56) References Cited

U.S. PATENT DOCUMENTS 5,606,184 A 2/1997 Abrokwah et al.
5,942,773 A 8/1999 Kaneko
(Continued)

FOREIGN PATENT DOCUMENTS

JP 09-172165 6/1997
JP 10-56026 2/1998
(Continued)

OTHER PUBLICATIONS

Official Action issued Nov. 25, 2015 in counterpart Taiwan Patent Application.
(Continued)

*Primary Examiner* — Jamie C Niesz
(74) *Attorney, Agent, or Firm* — Duane Morris LLP

(57) ABSTRACT

A semiconductor device comprises a semiconductor substrate; a channel layer of at least one III-V semiconductor compound above the semiconductor substrate; a gate electrode above a first portion of the channel layer; a source region and a drain region above a second portion of the channel layer; and a dopant layer comprising at least one dopant contacting the second portion of the channel layer.

18 Claims, 13 Drawing Sheets

(51) Int. Cl.

| | | |
|---|---|---|
| *H01L 21/225* | (2006.01) | |
| *H01L 29/66* | (2006.01) | |
| *H01L 29/78* | (2006.01) | |
| *H01L 21/306* | (2006.01) | |
| *H01L 21/31* | (2006.01) | |
| *H01L 21/324* | (2006.01) | |
| *H01L 29/08* | (2006.01) | |
| *H01L 29/205* | (2006.01) | |

(56) References Cited

U.S. PATENT DOCUMENTS

| | | | |
|---|---|---|---|
| 7,488,631 B2 | 2/2009 | Yagishita | |
| 8,053,344 B1* | 11/2011 | Fung | H01L 21/2257 257/E21.135 |
| 8,067,799 B2 | 11/2011 | Choi | |
| 2006/0255366 A1 | 11/2006 | Sheppard et al. | |
| 2008/0157208 A1 | 7/2008 | Fischer et al. | |
| 2008/0237636 A1 | 10/2008 | Jin et al. | |
| 2010/0301392 A1* | 12/2010 | Ko | H01L 21/28264 257/192 |
| 2011/0068348 A1 | 3/2011 | Passlack | |
| 2011/0297916 A1 | 12/2011 | Bennett | |
| 2012/0012903 A1 | 1/2012 | Nieh et al. | |
| 2012/0018702 A1* | 1/2012 | Javey | H01L 21/2233 257/14 |
| 2012/0049201 A1 | 3/2012 | Yamaguchi et al. | |
| 2012/0187505 A1* | 7/2012 | Guo | H01L 29/0847 257/401 |
| 2012/0256238 A1* | 10/2012 | Ning | H01L 21/84 257/280 |
| 2013/0157450 A1 | 6/2013 | Fitz et al. | |
| 2013/0200443 A1 | 8/2013 | Lavoie et al. | |
| 2013/0234205 A1 | 9/2013 | Oxland | |
| 2013/0277752 A1 | 10/2013 | Glass et al. | |
| 2014/0008699 A1 | 1/2014 | Oxland | |

FOREIGN PATENT DOCUMENTS

| | | |
|---|---|---|
| JP | 2000-277533 | 10/2000 |
| JP | 2001-308319 | 11/2001 |
| JP | 2012-049248 | 3/2012 |
| KR | 10-2006-0127046 | 12/2006 |
| KR | 10-2007-0114463 | 12/2007 |
| TW | 200634914 | 10/2006 |
| TW | 200746263 | 12/2007 |
| TW | 200943389 | 10/2009 |
| TW | 201117294 | 5/2011 |
| TW | 201131761 | 9/2011 |

OTHER PUBLICATIONS

Official Action issued Apr. 23, 2014 in counterpart KR Patent Application No. 10-2013-0049445.

Zhang, X. et al., "In0.7Ga0.3As Channel n-MOSFET with Self-Aligned Ni-InGaAs Source and Drain", Electrochemical and Solid-State Letters, 2001, 14(2):H60-H62.

Oxland, R. et al., "An Ultralow-Resistance Ultrashallow Metallic Source/Drain Contact Scheme for III-V NMOS", IEEE Electron Device Letters, Apr. 2012, 32(4):501-503.

Official Action issued Jan. 22, 2014 in counterpart Korean Patent Application No. 10-2013-0021957 (translation included), 11 total pages.

Fischetti, M.V. et al., "Simulation of Electron Transport in High-Mobility MOSFETs: Density of States Bottleneck and Source Starvation", 2007 IEEE International Electron Devices Meeting, Dec. 10-12, 2007, pp. 109-112.

Official Action issued Mar. 12, 2014 in counterpart Taiwan Patent Application.

Official Action issued Jul. 22, 2014 in counterpart KR patent application No. 10-2012-0143404.

Official Action issued Dec. 10, 2013 in counterpart KR patent application No. 10-2012-0143404.

Qiu, Z. et al., "A Comparative Study of Two Different Schemes to Dopant Segregation at NiSi/Si and PtSi/Si Interfaces for Schottky Barrier Height Lowering", IEEE Transactions on Electron Devices, Jan. 2008, 55 (1):396-403.

"CMOS", from Wikipedia retrieved at http://en.wikipedia.org/wiki/CMOS, 9 pages.

Kim, S.H. et al., "Self-aligned metal Source/Drain InxGa1-xAs n-MOSFETs using Ni-InGaAs alloy", 2010 IEEE International Electron Devices Meeting (IEDM), Dec. 2010, pp. 26.6.1-26.6.4.

Kim, S.H. et al., "Self-aligned metal source/drain InP n-metal-oxide-semiconductor field-effect transistors using Ni-InP metallic alloy", Applied Physics Letters, 2011, 98:243501-1 through 243501-3.

Wittmer, M. et al., "Low-temperature diffusion of dopant atoms in silicon during interfacial silicide formation", Physical Review B, Feb. 1994, 29(4):2010-2020.

Barnett, J. et al., "Advanced Techniques for Achieving Ultra-Shallow Junctions in Future CMOS Devices", 2010 International Workshop on Junction Technology (IWJT), May 2010, 4 pages.

Zhang, X. et al., "In0.7Ga0.3As Channel n-MOSFETs with a Novel Self-Aligned Ni-InGaAs Contact formed using a Salicide-like Metallization Process", International Symposium on VLSI Technology, Systems and Applications (VLSI-TSA), Apr. 2011, 2 pages.

\* cited by examiner

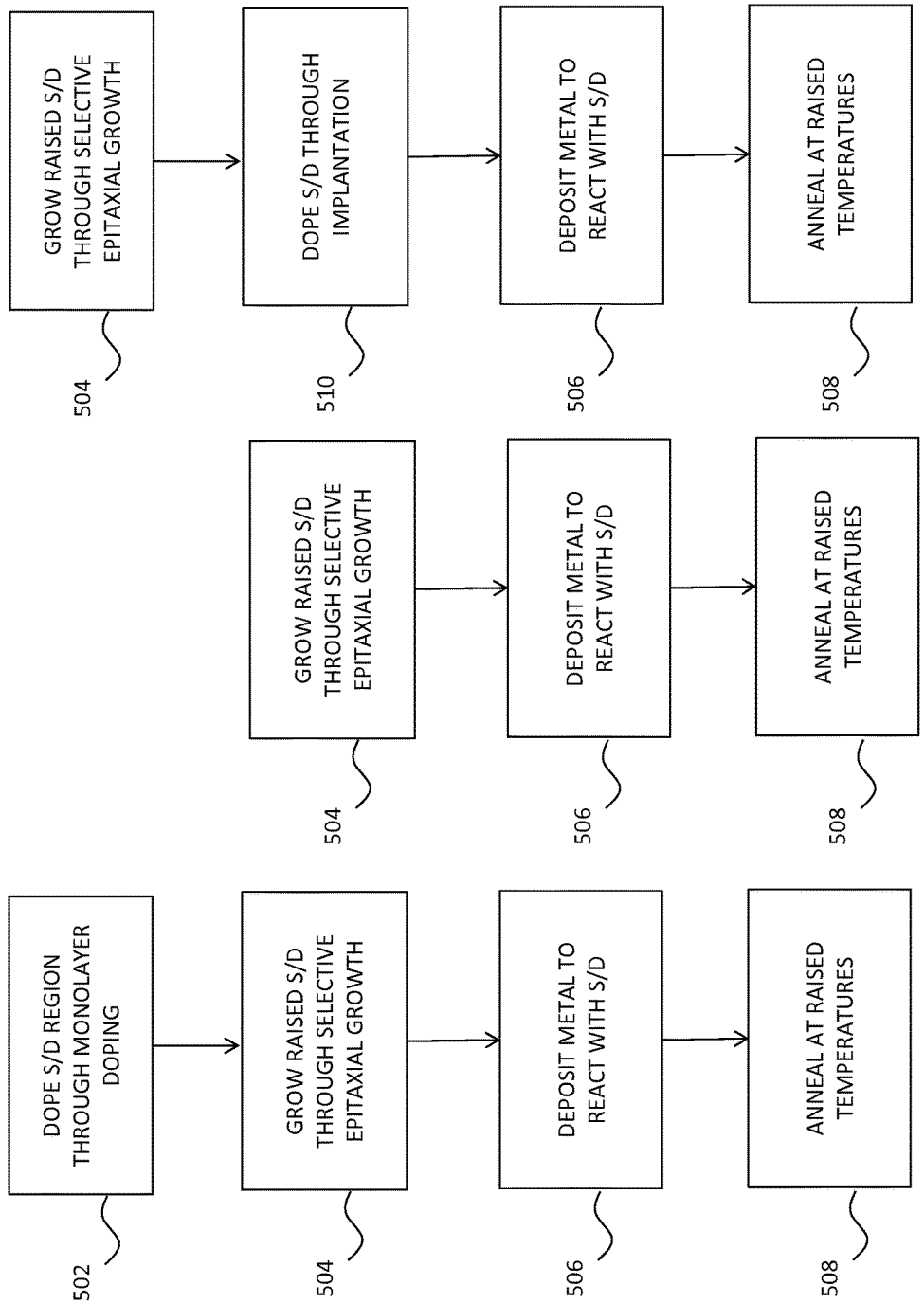

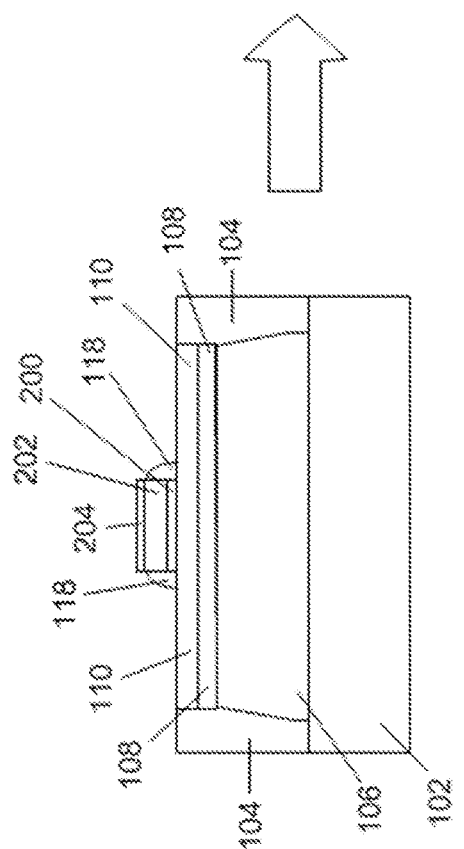
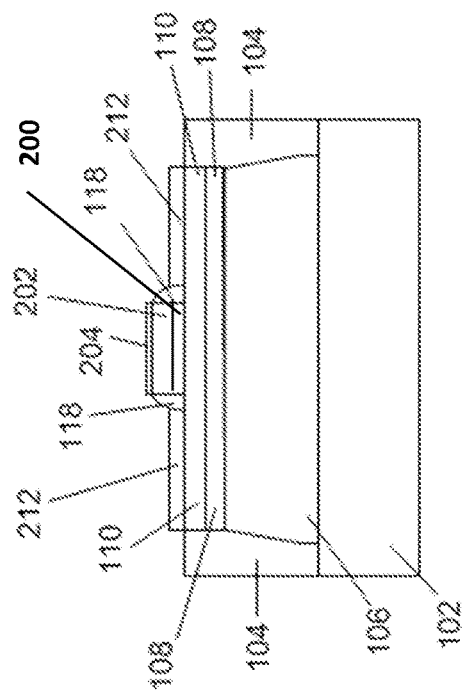
FIG. 10A
FIG. 10B

III-V COMPOUND SEMICONDUCTOR DEVICE HAVING DOPANT LAYER AND METHOD OF MAKING THE SAME

PRIORITY CLAIM AND CROSS-REFERENCE

This application is a divisional application of U.S. patent application Ser. No. 13/467,133, filed May 9, 2012, which application is expressly incorporated by reference herein in its entirety.

FIELD

The disclosure relates to III-V compound semiconductor device, and methods of manufacturing the same.

BACKGROUND

As complementary metal oxide semiconductor (CMOS) devices are scaled to smaller sizes for future technologies, new materials and concepts are necessary to meet the advanced performance requirements.

CMOS technology includes N-type metal oxide semiconductor (NMOS) and P-type metal oxide semiconductor (PMOS). For example, a metal-oxide-semiconductor field-effect transistor (MOSFET) is a transistor used for amplifying or switching electronic signals. One aspect of high performance in NMOS and PMOS and various other devices is device switching frequency. For devices to operate at high frequencies, it is necessary to have a low resistance, including a low contact resistance between metal interconnect structures and the channel of the NMOS and PMOS transistors. Contact is made to the gate electrodes, as well as to both the source and drain regions, of the associated transistors.

III-V compound semiconductors are potential channel materials for future CMOS devices because of their high mobility and low carrier effective mass. One challenge is to reduce resistance in the source/drain (S/D) extensions to maximize the performance of the associated transistors in III-V semiconductor CMOS technology.

BRIEF DESCRIPTION OF THE DRAWINGS

The present disclosure is best understood from the following detailed description when read in conjunction with the accompanying drawings. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIGS. 5A-5C are flow chart diagrams illustrating methods of fabricating the exemplary CMOS devices without recess of the source/drain (S/D) region.

FIGS. 10A-10B illustrate a method of selective epitaxial growth of the source and the drain (S/D) region in accordance with one embodiment.

DETAILED DESCRIPTION

Figure 1A:
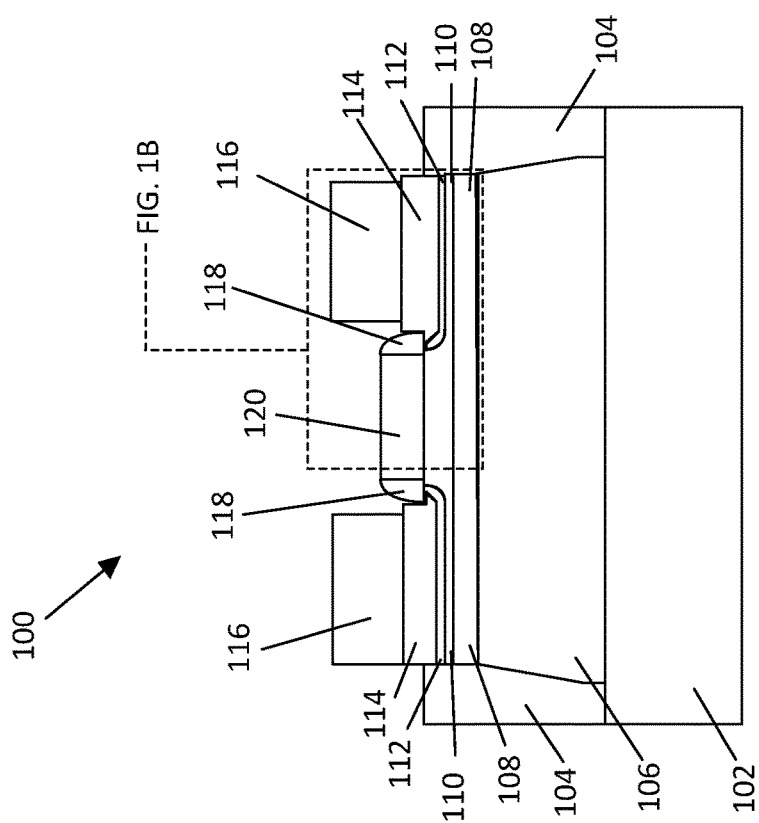
FIG. 1A illustrates a cross-sectional view of an exemplary III-V semiconductor MOSFET device according to the disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

III-V compound semiconductors are potential channel materials for future CMOS devices because of their high electron mobility. In some III-V semiconductor CMOS devices, undoped source/drain (S/D) regions are used. Two challenges include reducing resistance in the source/drain extension regions and reducing source/drain contact resistance.

A III-V compound semiconductor device and a method of making the same are provided to reduce external/extrinsic resistance in the S/D extension region. The semiconductor device comprises a semiconductor substrate; active layers of at least one III-V semiconductor compound comprising a channel above the semiconductor substrate; a gate stack region above a first portion of the channel layer; a source region and a drain region on either side of the gate region in a second portion of the channel layer in some embodiments extending above the position of the surface of the channel layer; and a dopant layer comprising at least one dopant between the source and drain regions and the channel layer.

In the embodiments, the dopant layer comprising at least one dopant contacting at least one portion of the channel layer provides low the external resistance in either a PMOS or NMOS device. In some embodiments, the S/D region in a PMOS or NMOS device comprises a metal-III-V-semiconductor ternary, quaternary or quinary compound with low resistivity. In some embodiments, the metal-III-V-semiconductor compound is thermodynamically stable when contacting semiconductor materials.

In some embodiments, a method for forming such a semiconductor device comprises:

providing a channel layer of at least one III-V semiconductor compound above a semiconductor substrate;

forming a gate electrode above a first portion of the channel layer;

providing a dopant layer comprising at least one dopant contacting the channel layer; and forming a source region and a drain region above a second portion of the channel layer.

In some embodiments, the step of providing the dopant layer includes forming a separate dopant layer above a portion of the channel layer and below the source or the drain (S/D) region. The dopant layer is formed through a process selected from the group consisting of a monolayer doping process, an in-situ doping process, an implantation process or any combination thereof, as described in detail below.

In some embodiments, a dopant is introduced into the channel in the S/D regions first. A metal is then introduced onto the channel or in the S/D regions, followed by thermal annealing. The metal reacts with the III-V semiconductor material in the S/D regions to form a metal-III-V-semiconductor compound in the S/D regions. The dopant has low solid solubility in the metal-III-V semiconductor compound. After thermal annealing, a dopant layer is formed between the channel and the S/D regions. In some embodiments, a localized highly doped channel layer is in the periphery of the S/D regions having the metal-III-V semiconductor compound. In some embodiments, the dopant diffuses into the channel at the interface.

Figure 1B:
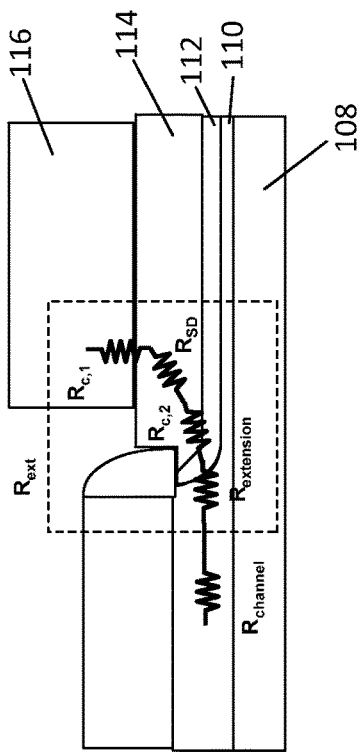
FIG. 1B is an enlarged detail of FIG. 1A, showing components of the MOSFET device resistance.

FIGS. 1A-1B illustrate a cross-sectional view of an exemplary III-V semiconductor MOSFET device according to one embodiment. The device is either a NMOS or a PMOS device. FIG. 1B is an expanded view of the source/drain regions.

As shown in FIG. 1A, a transistor structure 100 is formed over substrate 102, which, in some embodiments, is a semiconductor substrate such as silicon or silicon germanium or any other suitable semiconductor material. As in typical CMOS integrated circuits (ICs), the transistor comprises a shallow trench isolation region or a field oxide isolation region 104 above substrate 102. Trench region 104 is made of oxides or other suitable insulating materials.

Buffer layer 106 is disposed over substrate 102. Buffer layer 106 is a III-V compound semiconductor in one embodiment, while other suitable buffer layers can be used in other embodiments. In some embodiments, a buffer layer of III-V semiconductor compounds is made of a combination of materials including a material from groups IIIA (B, Al, Ga, In, Tl) and a material from group VA (N, P, As, Sb, Bi) on the periodic table of elements. Examples of a material for buffer layer 106 include GaAs, InP, InAs and other III-V materials, and are not limited to binary compound semiconductors.

Isolator layer 108 is disposed over buffer layer 106. In some embodiments, isolator layer 108 is a III-V compound semiconductor material as described above. Various suitable isolator materials include but not limited to CdTeSe, ZnSeTe, MgSeTe, InAlAs and AlAsSb, which are used as isolator layer 108 in various embodiments. In some embodiments, isolator layer 108 has a larger semiconductor bandgap than the channel material 110. In other embodiments, isolator layer 108 is a buried dielectric material. In some other embodiments, isolator layer 108 and buffer layer 106 have a lattice match for a high quality of epitaxial growth of channel layer 110.

Channel layer 110 is disposed above isolator layer 108. Channel layer 110 and isolator layer 108 are referred as "active layers." In some embodiments, channel layer 110 is a III-V semiconductor compound or other suitable materials. It is at least a binary material and may be a ternary material in various embodiments. In some other embodiments, channel layer 110 shares a lattice structure matching with those of isolator layer 108 and buffer layer 106, but they have different energy band gaps. In some embodiments, the material type of channel layer 110 determines the lattice structure, and the materials of isolator layer 108 and buffer layer 106 are selected based on such latter structure. For example, in one embodiment channel layer 110 is InAs, while isolator layer 108 is AlAsSb and buffer layer 106 is InAs.

According to some embodiments, channel layer 110 for NMOS is $In_xGa_{(1-x)}As$, with x>0.7 although other suitable binary or ternary NMOS channel materials may be used in other embodiments. According to some embodiments in which channel layer 110 for NMOS is $In_xGa_{(1-x)}As$, and x=1.0, NMOS channel material 108 is InAs.

According to some embodiments, channel layer 110 for PMOS is $In_yGa_{(1-y)}Sb$, with 0<y<1 in some embodiments but various other suitable binary or ternary materials may be used in other embodiments. In some embodiments, channel layer 110 for PMOS is InSb or GaSb.

A CMOS transistor gate stack structure 120 is disposed above a first portion of channel layer 110. Gate stack structure 120 includes gate electrode and an insulating gate dielectric layer formed over channel material 110 and defines the gate region. Gate dielectric layer is a high-k dielectric material but other suitable dielectric materials may be used in other embodiments. Gate electrode is formed of various suitable gate materials such as polysilicon, titanium nitride or other suitable semiconductor or metal materials.

For brevity, "gate electrode" is also used in this disclosure to encompass the gate stack structure 120. "Gate stack" is also used to refer to structure comprising a gate electrode and gate dielectric layer. In some drawings, the detailed structure of "gate stack" is not shown.

Spacer 118 is disposed along a side wall of gate stack 120. In some embodiments, spacers are not used. Spacers 118 may be formed of oxides, nitrides, oxynitrides, combinations thereof and other suitable insulating materials.

Source/drain regions 114 are disposed above a second portion of the channel layer. In some embodiments, source/drain regions 114 are made of a III-V semiconductor compound or a derivatives thereof. In some embodiments, a material for source/drain regions 114 is a metallic ternary compound, such as nickelide compound, of a III-V semiconductor compound such as NiInP, NiInAs, and NiInSb. Such are examples only and in other embodiments, other suitable ternary nickelide materials or other suitable metal semiconductor ternary, quaternary or quinary materials may be used in source/drain region 114. A material for source/drain region 114 is a low-resistance material as described above, and may include a resistance ranging from about 40 to 200 Ohms/sq. Compositions and method of making a ternary (or other combination) compound of a III-V semiconductor material and a metal or metals are disclosed in U.S. application Ser. No. 13/414,437 in the name of the same inventors.

Metal contact structure 116 is coupled to source/drain regions 114, and in various embodiments, suitable low resistivity conductive metals such as tungsten, copper, aluminum or their alloys or various other metals, are used as metal contact structure 116.

In some embodiments, semiconductor device 100 also comprises a separate dopant layer 112 comprising at least one dopant contacting the second portion of channel layer 110. In one embodiment, dopant layer 112 directly contacts the second portion of channel layer 110. Dopant layer 112 is between the second portion of channel layer 110 and source/drain region 114 in some embodiments, but other suitable configurations and structures are suitable. In some embodiments, dopant layer 112 is formed at the interface of channel layer and source/drain. In some other embodiment, dopant layer 112 extends partially into the channel layer.

In some embodiments, semiconductor device 100 is an NMOS transistor, and channel layer 110 is $In_xGa_{(1-x)}As$, with x>0.7. In some embodiments, the dopant in dopant layer 112 is selected from the group consisting of sulfur and silicon or any other suitable material which shows limited solid solubility in the S/D metal-semiconductor compound. In some embodiments, semiconductor device 100 is a PMOS transistor, and channel layer 110 is $In_yGa_{(1-y)}As$, with 0<y<1. In some embodiments, the dopant is beryllium, germanium, tin, carbon, or any other suitable material which shows limited solid solubility in the S/D metal-semiconductor compound.

Dopant layer is formed through a process selected from the group consisting of a monolayer doping process, an in-situ doping process, an implantation process, and any combinations thereof. These processes of forming a dopant layer are described in details hereafter in related steps shown in FIGS. 5A-5C.

The resistance of source/drain extensions ($R_{extension}$) is reduced with introduction of dopant layer 112. In some embodiments, $R_{extension}$ is further reduced with a combination of dopant layer 112 and source/drain (S/D) regions 114 comprising a metal-semiconductor compound such as nickelide, of III-V semiconductor compound. Reduction in total resistance of device 110 can be demonstrated in the following equation:

$$R_{total}=R_{channel}+2*(R_{S/D}+R_{extension}+R_{c,1}+R_{c,2})$$

where $R_{total}$ is total resistance of device 110;
$R_{S/D}$ is resistance of source/drain regions 114;
$R_{channel}$ is resistance of channel layer 110;
$R_{extension}$ is resistance of the region under the spacer;
$R_{c,1}$ is contact resistance between metal contact structure 116 and source/drain regions 114;
$R_{c,2}$ is contact resistance between source/drain regions 114 and channel layer 110.

In some embodiments, dopant layer 112 provides higher conductivity by doping the channel layer 110 or providing a high conductivity intermediate layer and decreases resistance between source drain 114 and channel layer 110 ($R_{c,2}$). In some other embodiment, source/drain (S/D) regions 114 comprising a metal-semiconductor compound such as nickelide, of III-V semiconductor compound, further decrease $R_{S/D}$ and contact resistance $R_{c,1}$ and $R_{c,2}$. In some embodiments, both dopant layer 112 and source/drain (S/D) regions 114 comprising a metallic ternary compound decrease $R_{extension}$.

The shape and dimension of device 100 and each portion in FIGS. 1A and 1B are for illustration purpose only. For example, source/drain regions 114 are recessed in some embodiments as shown in FIG. 1A-1B. In some embodiments, source/drain regions 114 are not recessed. In the "recessed" source/drain regions, the channel layer 110 are etched before formation of source/drain regions 114 so that a portion of the source region or the drain region or both is below a bottom height of the spacer. In some embodiments, regrowth of source/drain regions 114 are performed through a selective epitaxial growth technique. In some other embodiments, source/drain regions 114 are disposed after recess without using an epitaxial growth technique.

Figure 2:
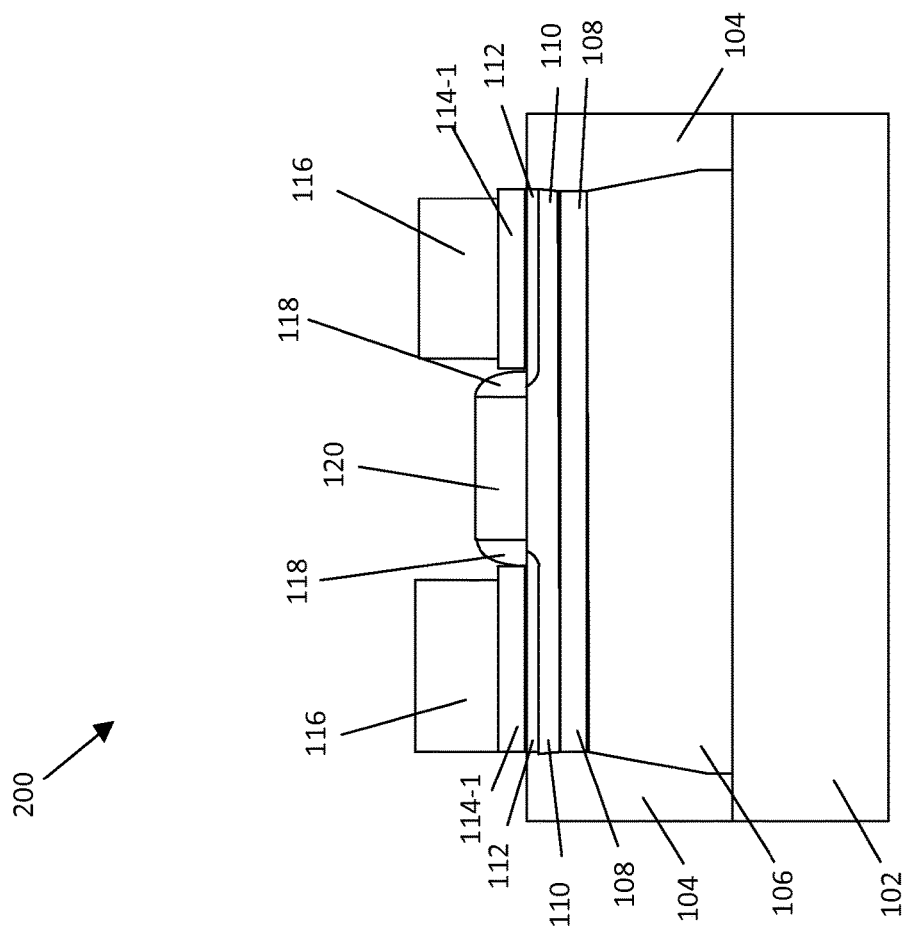
FIG. 2 illustrates a cross-sectional view of an exemplary CMOS device without recess of the source/drain (S/D) region in accordance with one embodiment.

FIG. 2 illustrates a cross-sectional view of an exemplary CMOS device 200 without recess of the source/drain (S/D) region in accordance with one embodiment. In FIG. 2, like items are indicated by like reference numerals, and for brevity, descriptions of the structures, provided above with reference to FIGS. 1A and 1B are not repeated.

The exemplary device 200 in FIG. 2 is similar to that in FIG. 1A-1B, except that the source/drain regions 114-1 are not recessed.

Figure 3:
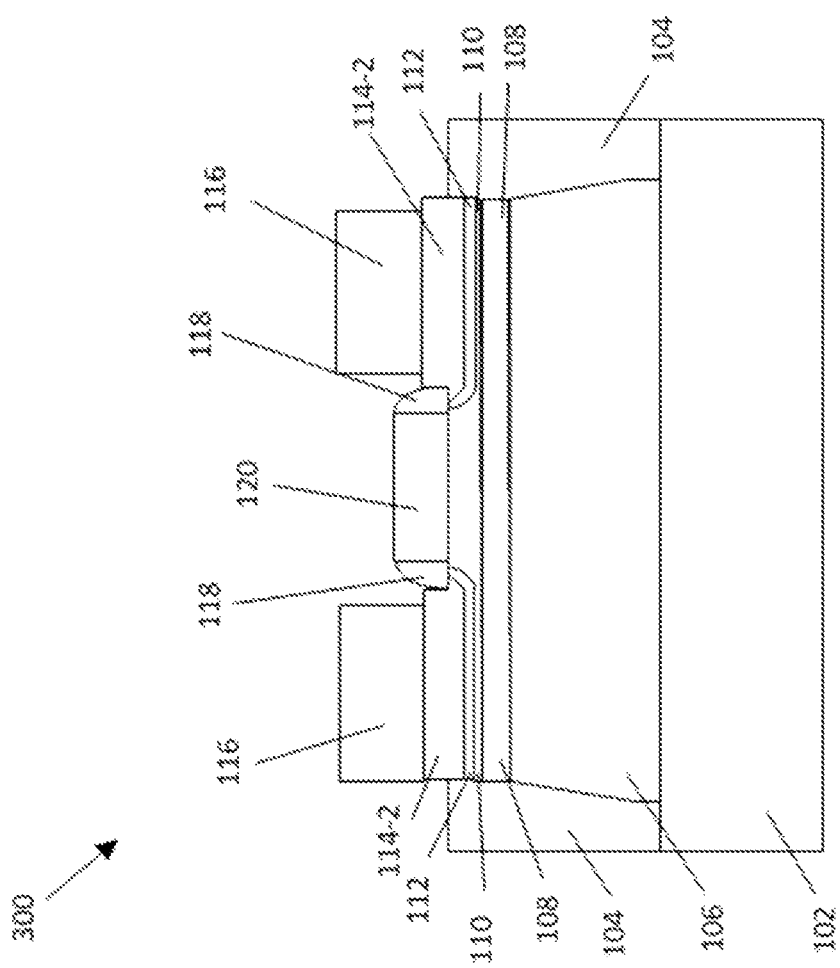
FIG. 3 illustrates a cross-sectional view of an exemplary CMOS device with recess of the source/drain (S/D) region in accordance with one embodiment.

FIG. 3 illustrates a cross-sectional view of an exemplary CMOS device with recess of the source/drain (S/D) region in accordance with one embodiment.

The device in FIG. 3 is similar to that in FIG. 1A. FIG. 1A is a cross-sectional view of a device in this disclosure. The source/drain regions are recessed in some embodiments, and are not recessed in some other embodiments. In some embodiments illustrated in FIG. 3, source/drain regions 114-2 are recessed so that a portion of the source region or the drain region or both is below a bottom height of the spacer.

Figure 4:
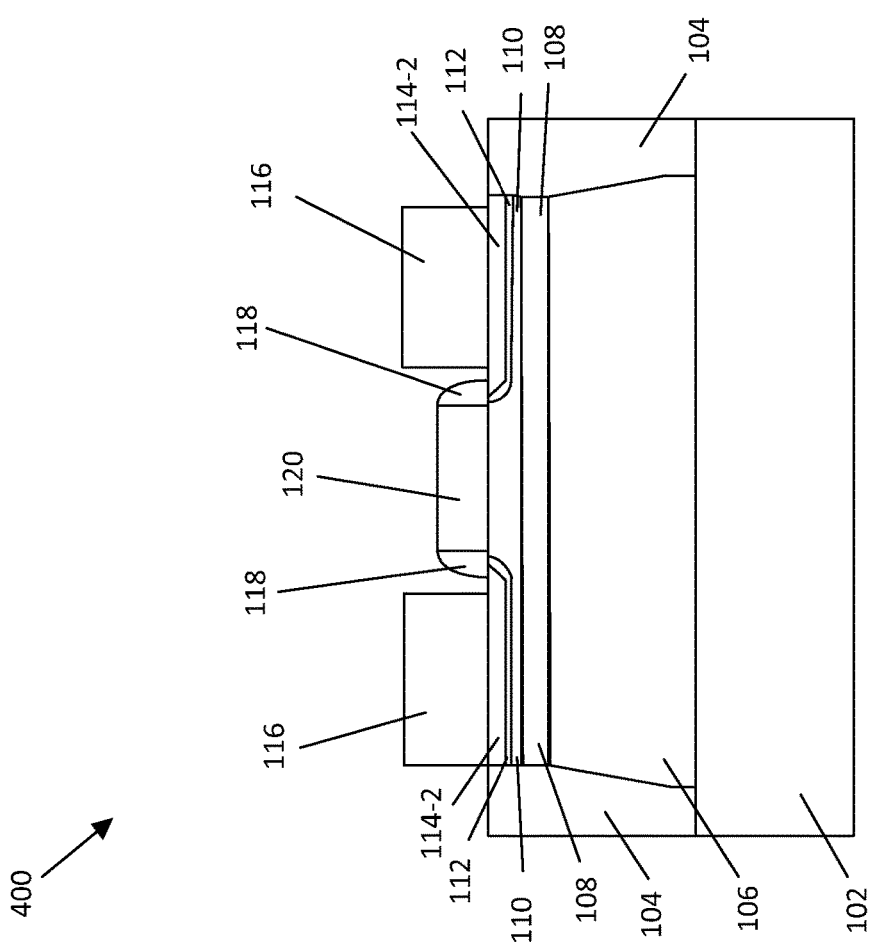
FIG. 4 illustrates a cross-sectional view of an exemplary CMOS device without epitaxial growth of the source/drain (S/D) region in accordance with one embodiment.

FIG. 4 illustrates a cross-sectional view of an exemplary CMOS device 400 without recess or epitaxial growth of the source/drain (S/D) region in accordance with one embodiment.

In some embodiments, semiconductor device 400 is an NMOS transistor. Channel layer 110 is $In_xGa_{(1-x)}As$, with x>0.7. In some embodiments, the dopant in dopant layer 112 is selected from the group consisting of sulfur and silicon. Source/drain (S/D) regions 114-2 comprising a metal-semiconductor compound, such as nickelide, of III-V semiconductor compound. The examples of source/drain (S/D) regions 114-2 include but are not limited to NiInAs, NiInP, and NiInSb. In one embodiment, dopants are introduced through a mono-layer doping technique. Nickel or other suitable metals are deposited onto source/drain regions, and then fully reacted to form the metallic compound.

According the foregoing described embodiments, III-V compound semiconductor devices, which include a dopant layer or locally doped channel region comprising at least one dopant contacting a second portion of the channel layer, can be fabricated based on different combination of the described structures. For example, the device can be either a PMOS or NMOS device. The source/drain (S/D) regions can be recessed or not recessed. When the S/D regions are recessed, additional semiconductor material can be added to the S/D regions. In some embodiments, the variations in the structure are further combined with different processing steps of forming the dopant layer and the source/drain regions, as described below.

FIGS. 5A-5C, 6A-6C, and 7A-7B are flow chart diagrams to illustrate certain process steps and their combinations used to make the disclosed devices. The steps of forming a trench, a buffer layer, an isolator layer, a channel layer, a gate electrode including the dielectric layer, a spacer, and a metal contact structure above the substrate are not shown in the related diagrams.

FIGS. 8A-8B, 9A-9C, 10A-10B, and 11A-11B are schematic cross-sectional diagrams to illustrate some of the key process steps including recessing the source/drain regions; forming the dopant layer through monolayer doping; regrowing the source/drain regions through selective epitaxial growth; forming a metallic ternary phases of III-V semiconductor compound in the source/drain regions, including forming the dopant layer (or doped region) at the periphery of the metal-semiconductor S/D region. Steps of FIGS. 5A-5C, 6A-6C, and 7A-7B, corresponding to FIGS. 8A-11B are individually described below.

In some embodiments of this disclosure, dopant layer 112 is formed by introducing a dopant into the S/D regions through a process selected from the group consisting of a monolayer doping process, an in-situ doping process, an ion implantation process and any combination thereof. A metallic ternary material is formed through a method comprising coating a layer of metal above source/drain regions 114, followed by annealing at a raised temperature in accordance with some embodiments. Through this process, the dopant is driven out of the S/D region to the channel 110 at the periphery of the S/D regions 114. Alternatively, a dopant layer 112 is formed between the S/D regions 114 and the channel 110. In some embodiments, source/drain regions 114 are recessed through an etching step. In some embodiments, the recessed source/drain regions are regrown through selective an epitaxial growth technique. As described as follows, various combinations of these steps of different techniques are combined to form the disclosed semiconductor devices.

FIGS. 5A-5C are flow chart diagrams illustrating methods of fabricating the exemplary CMOS devices without recess of the source/drain (S/D) region but with deposition, for example, by selective epitaxial growth, of raised S/D material.

At step 502, at least one dopant is introduced to the S/D regions through a technique of monolayer doping (MLD). In a MLD process, a III-V semiconductor surface is coated with a dopant using a precursor in the form of a liquid, solid or gas. The coating can be achieved through dipping coating, spraying coating, spin coating, or atomic layer deposition (ALD) or a plasma based technique, or any other suitable coating method. After application by a precursor, the dopant is coated at monolayer or at nanometer-level in thickness. The coated surface is then capped with dielectric materials, followed by annealing at a raised temperature. The dopant diffuses into the III-V semiconductor surfaces. In these embodiments, such dopants have low or no solubility in a metallic metal-semiconductor compound formed in steps 505 and 508. At step 502, in some embodiments, a dopant precursor is coated onto the surface of channel 110.

Figure 9A:
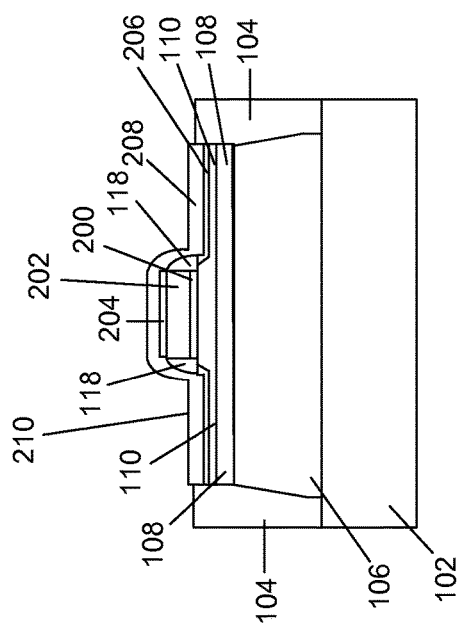
FIGS. 9A-9C are schematic diagrams illustrating steps of forming a dopant layer through a method of monolayer doping in accordance with one embodiment.
Figure 9B:
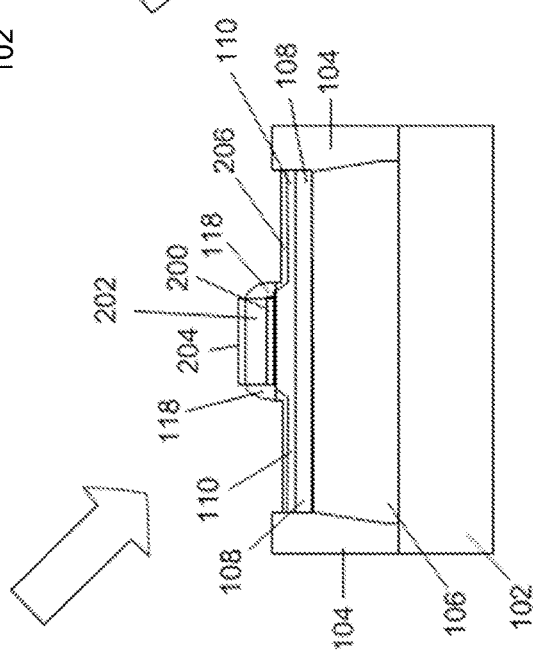
Figure 9C:
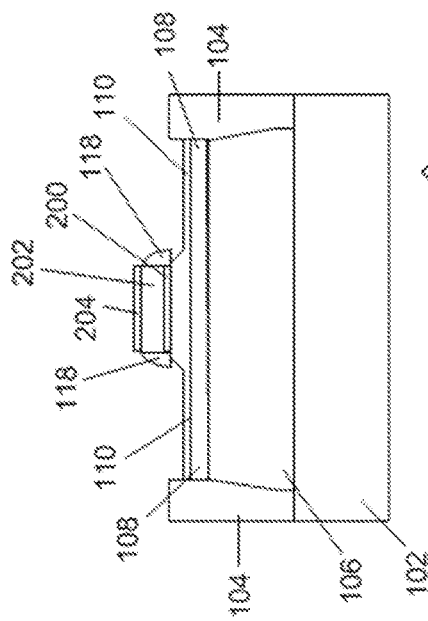

At step 502, in some embodiments the MLD technique comprises at least two steps which are illustrated in FIGS. 9A-9C. FIG. 9A shows a device structure in the fabrication process in the beginning of step 502 of FIG. 5A. Similar to that described in FIG. 1A, the device at this stage comprises channel layer 110 above substrate 102. The gate stack above channel layer 110 are illustrated in details in FIG. 9A. The gate stack or "gate electrode" includes gate dielectric layer 200, gate electrode 202, and another layer gate electrode 204. The gate stack of these three parts (200, 202, and 204) constitutes gate stack 120 in FIG. 1A. In some embodiments, the channel has not been recessed in the S/D regions prior to mono-layer doping.

In some embodiments, in the first sub-step of step 502 of FIG. 5A, a dopant layer 206 is disposed above and directly contacting with channel layer 110. At the completion of the first sub-step of step 502, the device is as illustrated in FIG. 9B. In the second step of step 502 of FIG. 5A, the coated surface is then capped with dielectric materials 208. At the completion of the second sub-step of step 502, the device is as illustrated in FIG. 9C. After annealed at a raised temperature, a separate dopant layer 112 as illustrated in FIG. 1A is formed.

In some embodiments, this MLD technique comprises one, two or multiple steps.

For example, in some embodiments, a monolayer sulfur dopant can be formed on a III-V semiconductor compound surface as follows: a MLD reactive solution as the dopant precursor comprises 20 wt % of $(NH_4)_2S$ and about 1.3 wt % of sulfur in water at 35° C. InGaAs surface is thoroughly cleaned by using HF solution followed by isopropanol. InGaAs surface is then immersed into the MLD reactive solution for 15 minutes, then rinsed in deionized water, the channel surface in the S/D region is thus covered with a thin layer of sulfur and then can be capped with dielectrics such as SiN and thermally annealed through rapid thermal anneal (RTA). In some embodiments, the annealing is conducted at a high temperature, for example, at 700° C. for 30 seconds. The dielectric capping layer can then be removed. This doping method is described by Barnett, et. al. for doping a NMOS junction. See 2010 Workshop on Junction Technology, 2010 IEEE, 978-4244-5869-1.

Turning back to FIG. 5A, at step 504, the S/D regions are grown using a selective epitaxial growth technique. In some embodiments, this step follows the standard procedures used for III-V semiconductor compounds. FIGS. 10A-10B schematically illustrate a method of selective epitaxial growth of the source/drain (S/D) regions 212 in accordance with one embodiment. The S/D regions through epitaxial growth include a thickness of about 5-200 nm according to some embodiments and is InAs in one embodiment. In other embodiments, the S/D regions are formed of InGaAs, InP, InSb or other suitable semiconductor materials.

In some embodiments, during the selective epitaxial growth of a III-V semiconductor in the source/drain regions, dopants are optionally introduced in the grown layer as part of the epitaxial process.

At step 506, a metal layer is deposited on the S/D regions, which comprise a III-V semiconductor compound.

Figure 11B:
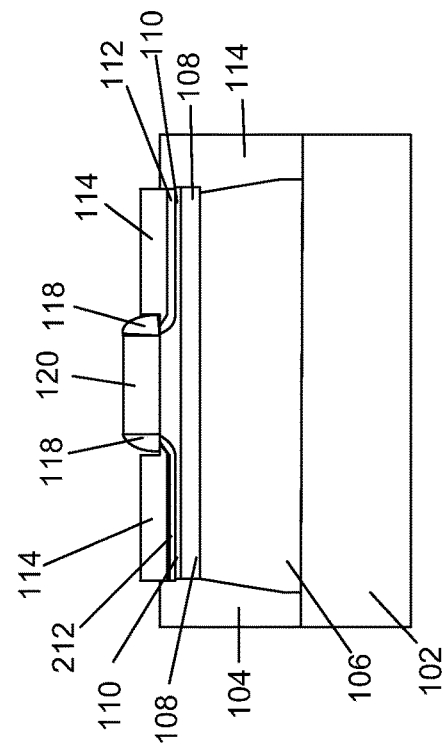
FIGS. 11A-11B illustrate steps of a method of forming a metallic metal-semiconductor compound material, comprising coating a layer of metal followed by annealing at a raised temperature in accordance with one embodiment.
Figure 11A:
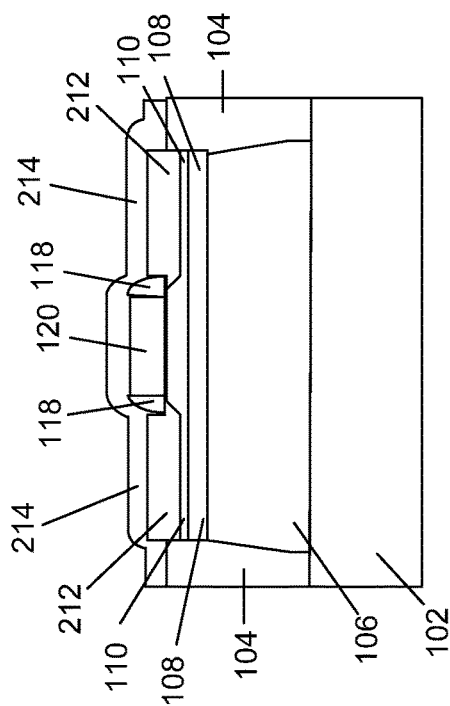

At step 508, the metal layered coated structure from step 506 is annealed at a raised temperature to form a metallic metal-semiconductor compound material of a III-V semiconductor compound. FIGS. 11A-11B illustrate steps of the method of forming a metallic ternary, quaternary or quinary material in S/D regions 114, comprising coating a layer of metal 214 followed by annealing at a raised temperature in accordance with one embodiment.

In FIG. 11A and step 506 of FIG. 5A (and FIGS. 5B-5C, 6A-6C and 7A-7B), a metal material is nickel in some embodiments and any other suitable metal in some other embodiments. Various conventional deposition methods such as sputtering, evaporation or other deposition (e.g. chemical vapor deposition CVD) methods may be used to form metal layer 214 such as nickel layer. Various thicknesses may be used. In some embodiments, metal layer 214 such as nickel may include a thickness ranging from about 5 nm to about 200 nm. According to some embodiments, metal layer 214 will be formed to include sufficient thickness to react with all of the S/D regions.

In FIG. 11B and step 508 of FIG. 5A (and FIGS. 5B-5C, 6A-6C and 7A-7B), a metal-semiconductor compound such as nickelide of a III-V semiconductor material is formed through annealing at high temperature. The thermal annealing causes reaction to form a ternary, quaternary or quinary nickelide material. The annealing operation can be a one-step operation or a multi-step operation. According to one embodiment, a two-step annealing process is used with the first step being a lower temperature step causing diffusion of the nickel metal into the underlying semiconductor material. After the first annealing step, a selective etching operation may optionally be used to remove unreacted nickel. A second annealing operation of the two-step annealing operation is carried out at higher temperature and, in some embodiments, forms a thermodynamically stable ternary material that includes low resistance as described above. In one embodiment, the first step of the annealing operation may be carried out within a temperature range of 275-325° C. and the second step of the two-step annealing operation may include a temperature in the range of 325-450° C.

The thermal annealing technique in some embodiments described herein also provides additional benefits to cause dopant segregation in the source/drain (S/D) regions, and drives formation of a dopant layer 112 at the periphery of the S/D region 114. In some embodiments, the dopant layer 112 may not be a distinct region of dopants but instead be a region of channel material 110 which is doped with the dopants. Dopant layer (or doped region of the channel layer) 112 is above channel layer 110. In some embodiments, dopant layer 112 directly contacts channel layer 110.

Such dopant segregation effect during thermal annealing is also referred to as "snow plow effect." In some embodiments described herein, "snow plow effect" or dopant segregation technique in III-V semiconductors is obtained. In some embodiments, a dopant segregation technique is provided to form a dopant rich layer near the nickelide/III-V semiconductor interface to achieve a low resistance extension region and to reduce the resistance between nickelide and channel material. In an example, the dopant segregation is achieved through nickel coating on a dopant-containing III-V semiconductor compound, followed by thermal annealing, in which a metallic ternary, quaternary or quinary nickelide material is also formed.

Examples of a metallic metal-semiconductor ternary, quaternary or quinary material include but are not limited to nickelide. In some embodiments, examples of a ternary nickelide include NiInP, NiInAs and NiInSb.

FIG. 5B illustrates a method of forming a device as described above in some embodiments, in which at least one dopant is introduced during growth of the S/D regions. In such a method, the processes steps are similar to that illustrated in FIG. 5A, except at step 504. At step 504 of FIG. 5B, a dopant is introduced simultaneously at the step of growing the source/drain regions through selective epitaxial growth of a III-V semiconductor compound. This doping process is referred as an in-situ doping technique.

In these embodiments, such dopants have low or no solubility in a metallic ternary, quaternary or quinary phase formed after steps 506 and 508. Dopant concentration can be non-uniform in the epitaxial S/D. For example, in some embodiments, higher concentration of dopants is nearer to the channel than to the surface. The dopants can be fully or partially driven close to or into the channel layer by the epitaxial growth process of step 504 and the thermal annealing of step 508.

FIG. 5C illustrates a method of forming the device in some other embodiments, in which at least one dopant is introduced into the S/D regions through an ion implantation process. Step 510 of ion implantation is performed after growth of the S/D regions at step 504, and before metal coating and thermal annealing at steps 506 and 508. An ion implantation process suitable for III-V semiconductor compound can be used. Typical ion implant beam energies would be 20-100 KeV with beam fluence 1E14-1E16 cm$^2$.

Figure 6A:
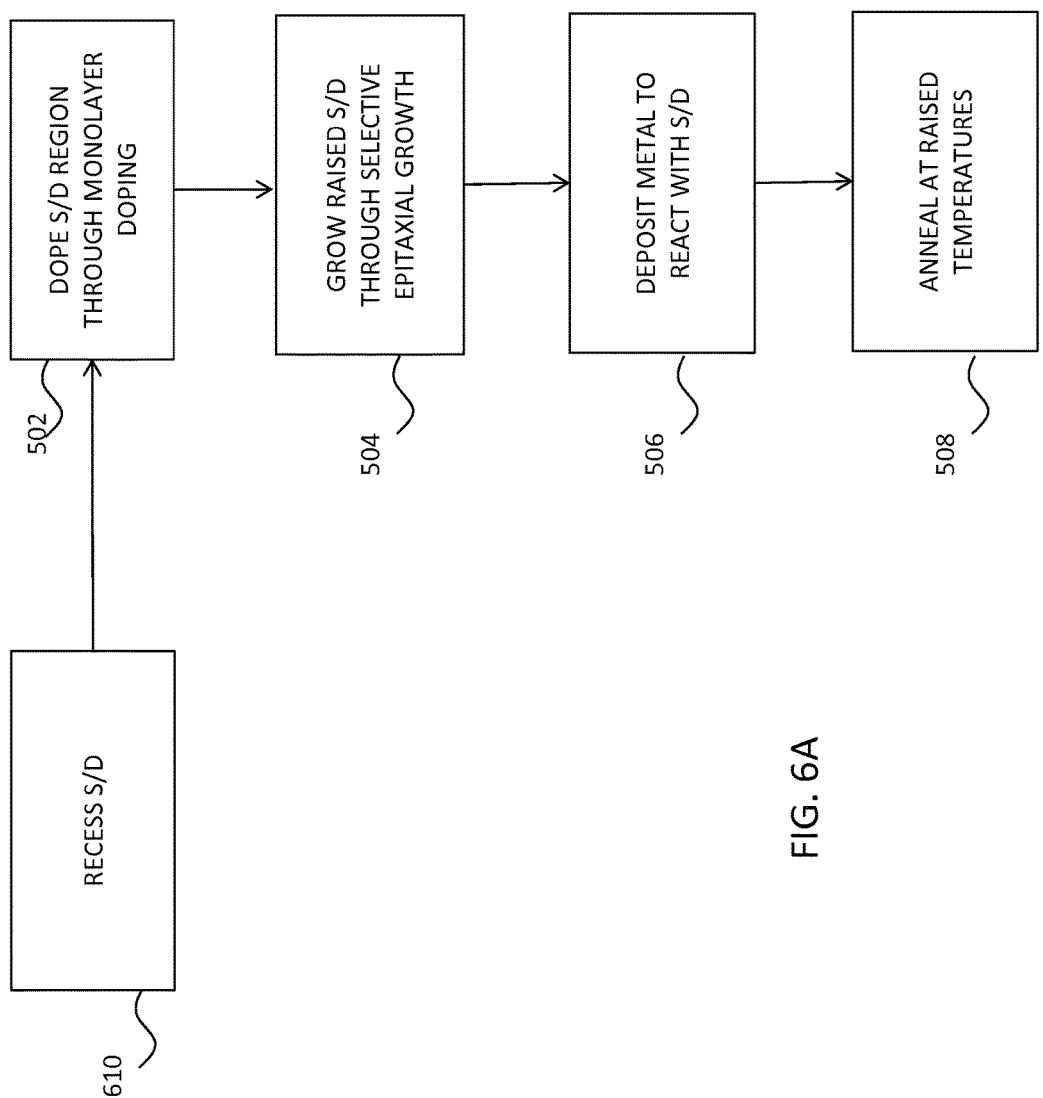
FIGS. 6A-6C are flow chart diagrams illustrating methods of fabricating the exemplary CMOS devices with recess of the source/drain (S/D) region.
Figure 6B:
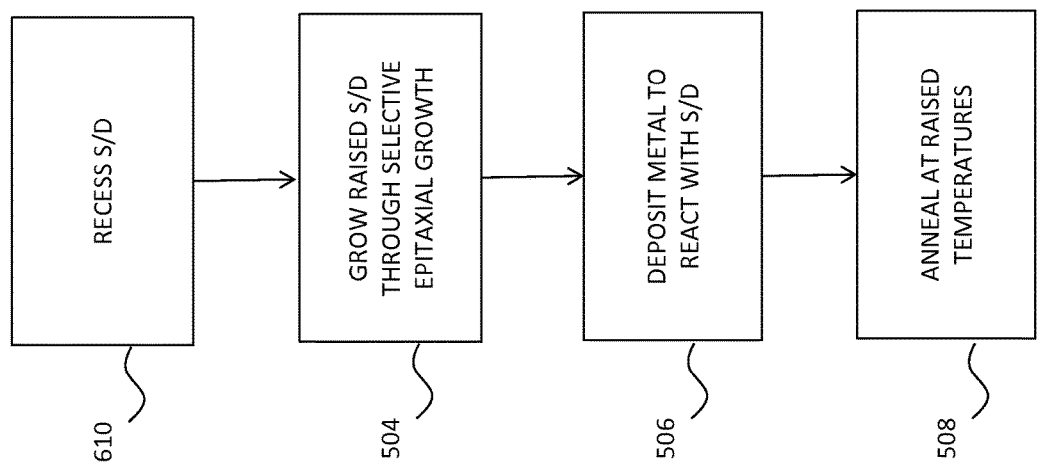
Figure 6C:
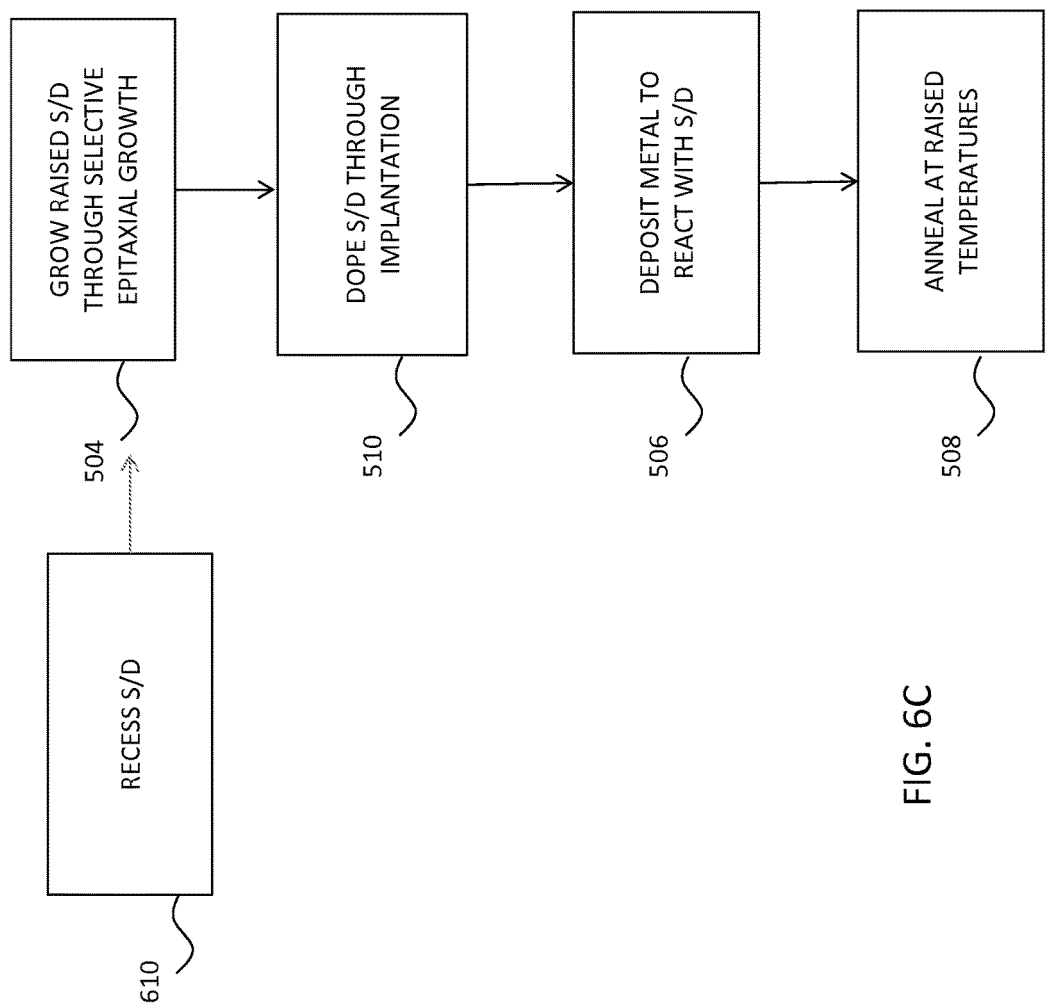

FIGS. 6A-6C are flow chart diagrams illustrating methods of fabricating the exemplary CMOS devices with recess of the source/drain (S/D) region.

Figure 8B:
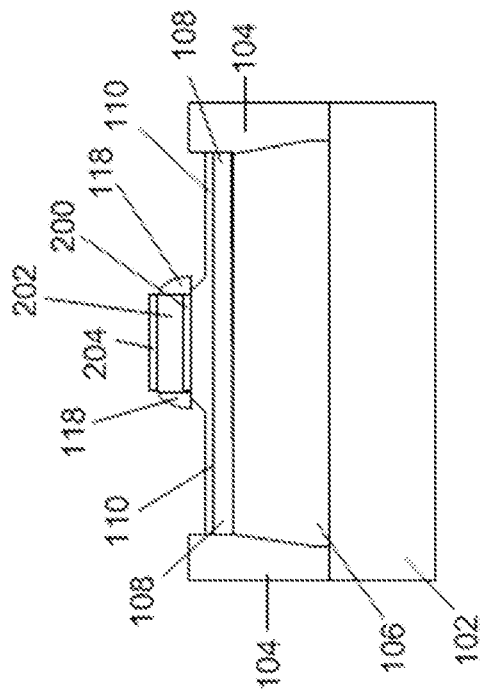
FIGS. 8A-8B illustrate a method of recessing the channel layer through etching in accordance with one embodiment.
Figure 8A:
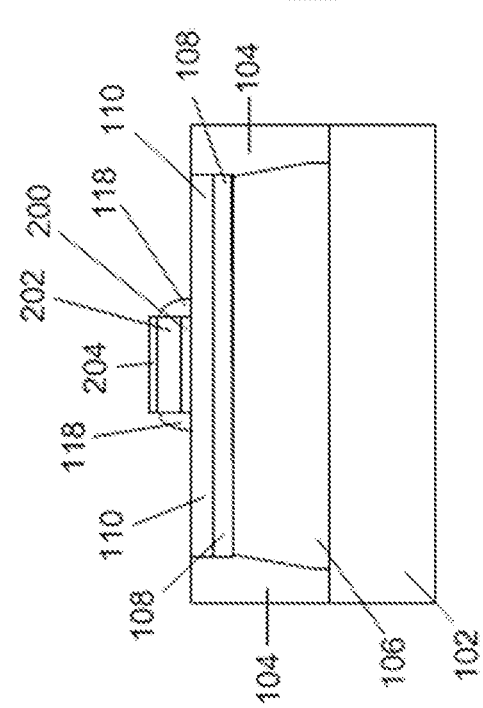

The methods in FIGS. 6A-6C are similar to those in FIGS. 5A-5C, respectively, except that a process of recessing the channel layer, step 610, is added in each method. FIGS. 8A-8B schematically illustrate such a method of recessing the channel layer 110 through etching in accordance with one embodiment. A gate stack structure including dielectric layer 200, gate electrode 202 and another gate layer 204, is disposed over a first portion of channel layer 110. A spacer is disposed along a side-wall of the gate stack structure. In some embodiments, the "recessing" process comprises at least one step as illustrated in FIG. 8A-8B. Before step 610, the device in the fabrication process is as shown in FIG. 8A.

In step 610, a second portion of channel layer 110 are so etched using standard processing techniques that a portion of the source/drain regions is below a bottom height of the spacer 118. At the completion of this step of recessing the channel 110, the configuration is as shown in FIG. 8B.

Figures 7A, 7B:
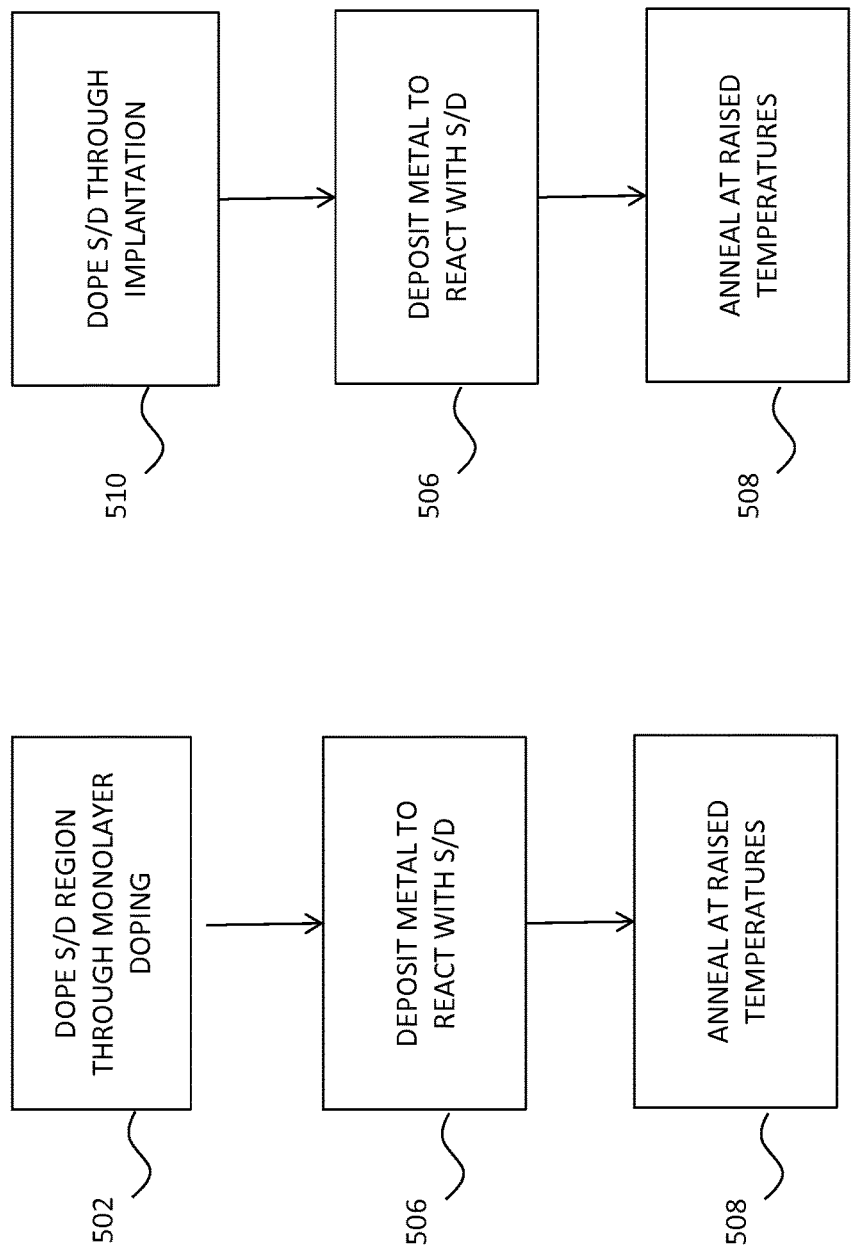
FIGS. 7A-7B are flow chart diagrams illustrating methods of fabricating the exemplary CMOS device without epitaxial growth of the source/drain (S/D) region in accordance with one embodiment.

FIGS. 7A-7B are flow chart diagrams illustrating methods of fabricating an exemplary CMOS device without epitaxial growth of the source/drain (S/D) region in accordance with some embodiments. In these embodiments, there is no recessing step and no regrowth of the S/D region through selective epitaxial growth. The S/D regions are disposed above the channel layer 110, which comprise a III-V semiconductor compound. At least one dopant is introduced into the S/D regions through a technique of monolayer doping (step 502) or ion implantation (step 510). The channel layer for NMOS is In$_x$Ga$_{(1-x)}$As with x>0.7 although other suitable binary or ternary NMOS channel materials may be used in other embodiments. According to the embodiment in which channel layer for NMOS is In$_x$Ga$_{(1-x)}$As and x=1.0, NMOS channel material is InAs. In one embodiment, metal in step 506 is nickel. The ternary material at step 508 is NiInAs. Dopant layer is driven toward the channel layer so that it will be close to or directly contact with the channel layer thorough snow plow effect described above.

In various embodiments, a III-V compound semiconductor device and a method of making the same are provided to reduce external/extrinsic resistance and resistance in the S/D extension region.

In some embodiments, a semiconductor device comprises a semiconductor substrate; a channel layer of at least one III-V semiconductor compound above the semiconductor substrate; a gate electrode above a first portion of the channel layer; a source region and a drain region above a second portion of the channel layer; and a dopant layer comprising at least one dopant contacting the second portion of the channel layer.

In some embodiments, the dopant layer comprising at least one dopant directly contacting at least one portion of the channel layer provides low contact resistance in either a PMOS or NMOS device. In some embodiments, the S/D region in a PMOS or NMOS device comprises a metal-III-V semiconductor ternary material with low resistivity and which is thermodynamically stable when contacting semiconductor materials. In some embodiments, the metallic ternary material is a nickelide of a III-V semiconductor compound.

In some embodiments, a semiconductor device comprises a spacer which is disposed along a side wall of the gate electrode. In some embodiments, a portion of the dopant layer is underneath the spacer. In some other embodiments, the channel layer or the source/drain regions are recessed so that a portion of the S/D regions is below a bottom height of the spacer.

In some embodiments, the disclosed semiconductor device is an NMOS transistor, and the channel layer is InxGa(1−x)As, with x>0.7. The dopant is selected from the group consisting of sulfur and silicon.

In some other embodiments, the semiconductor device is a PMOS transistor, and the channel layer is InyGa(1−y)As, with 0<y<1. The dopant is carbon or other suitable materials.

In some embodiments a method for forming such a semiconductor device comprises: providing a channel layer of at least one III-V semiconductor compound above a semiconductor substrate; forming a gate electrode above a first portion of the channel layer; providing a dopant layer comprising at least one dopant contacting the channel layer; and forming a source region and a drain region above a second portion of the channel layer.

In some embodiments, the step of providing the dopant layer includes forming the dopant layer above the channel layer and below the source or the drain (S/D) region. The dopant layer is formed through a process selected from the group consisting of a monolayer doping process, an in-situ doping process and an ion implantation process as described in this disclosure. In a monolayer doping process or an ion implantation process, at least one dopant can be introduced into the S/D regions. In an in-situ doping process, at least one dopant is introduced during the step of forming the S/D regions.

In some embodiments, a method of forming the disclosed semiconductor further comprises forming a metallic ternary material with a III-V semiconductor compound in the source region and the drain region. The step of forming a metallic ternary material comprises a step of depositing a metal layer on the III-V semiconductor compound in the source region and the drain region, followed by a step of annealing at a raised temperature. In some embodiment, the metal is nickel, which forms a ternary nickelide of III-V semiconductor compound.

In some embodiments, the disclosed method comprises disposing a spacer along a side wall of the gate electrode. In some embodiments, the method further comprises a step of recessing the channel layer before providing the dopant layer comprising at least one dopant contacting the channel layer.

In some other embodiments, the disclosed method comprises a step of forming the source region and the drain region above the second portion of the channel layer comprises disposing a portion of the source region and the drain region below a bottom height of the spacer.

In some other embodiments, the dopant is driven toward the channel layer to form a dopant-rich layer through dopant segregation effect or "snow plow effect," as described above. The dopant-rich layer is close to or directly contact with the channel layer.

In some embodiments, the S/D regions are grown or regrown thorough a selective epitaxial growth technique. In some other embodiments, the S/D regions are grown without using a selective epitaxial growth technique.

In some embodiment, a method for forming a NMOS semiconductor device is provided, in which no selective epitaxial growth of the S/D regions is used.

Although the subject matter has been described in terms of exemplary embodiments, it is not limited thereto. Rather, the appended claims should be construed broadly, to include other variants and embodiments, which may be made by those skilled in the art.

What is claimed is:

1. A method for forming a semiconductor device comprising steps of:
    providing a channel layer of at least one first III-V semiconductor compound above a semiconductor substrate;
    forming a gate electrode above a first portion of the channel layer;
    forming a source region and a drain region above a second portion of the channel layer, the source region and the drain region comprising a second III-V semiconductor compound; and
    forming a separate dopant layer of one dopant after forming the source region and the drain region, wherein the dopant layer is above a portion of the channel layer, and directly underlies and contacts the source or the drain region,
    wherein the step of forming the dopant layer comprises steps of:
    introducing the dopant into the source and the drain (S/D) regions comprising the second III-V semiconductor compound;
    depositing a metal layer on or above the S/D regions comprising the second III-V semiconductor compound and the dopant; and
    annealing the semiconductor device at a raised temperature so as to form a metallic material of the second III-V semiconductor compound in the S/D regions, and drive essentially all the dopant out from the S/D regions to form the separate dopant layer.

2. The method of claim 1, wherein the step of introducing the dopant into the source region and the drain region comprises a process selected from the group consisting of a monolayer doping process, an in-situ doping process, an implantation process, and any combination thereof.

3. The method of claim 1, wherein the metallic material is a ternary, quaternary or quinary metallic material with the second III-V semiconductor compound.

4. The method of claim 1, wherein the metallic material is a nickelide of the second III-V semiconductor compound.

5. The method of claim 1, further comprising disposing a spacer along a side wall of the gate electrode.

6. The method of claim 5, further comprising a step of recessing the channel layer before forming the dopant layer.

7. The method of claim 6, wherein the step of forming the source region or the drain region above the second portion of the channel layer comprises disposing a portion of the source region or the drain region below a bottom height of the spacer.

8. The method of claim 1, wherein the device is an NMOS transistor, and the channel layer is $In_xGa_{(1-x)}As$, with x>0.7.

9. The method of claim 8, wherein the dopant is selected from the group consisting of sulfur and silicon.

10. The method of claim 1, wherein the device is a PMOS transistor, and the channel layer is $In_yGa_{(1-y)}As$, with 0<y<1.

11. The method of claim 10, wherein the dopant is carbon.

12. A method for forming a semiconductor device comprising steps of:
    providing a channel layer of at least one first III-V semiconductor compound above a semiconductor substrate;
    forming a gate electrode above a first portion of the channel layer;

forming a source region and a drain region above a second portion of the channel layer, the source region and the drain region comprising a second III-V semiconductor compound; and forming a separate dopant layer of one dopant after forming the source region and the drain region, wherein the dopant layer is above a portion of the channel layer, and directly underlies and contacts the source or the drain region, wherein the step of forming the dopant layer comprises steps of:

introducing the dopant into the source and the drain (S/D) regions comprising the second III-V semiconductor compound, wherein the dopant is coated onto the second III-V semiconductor compound;

depositing a metal layer on or above the S/D regions comprising the second III-V semiconductor compound and the dopant; and annealing the semiconductor device at a raised temperature so as to form a metallic material of the second III-V semiconductor compound in the S/D regions, and drive essentially all the dopant out from the S/D regions to form the separate dopant layer.

13. The method of claim 12, wherein the dopant is formed on the second III-V semiconductor compound through a monolayer doping process.

14. The method of claim 12, wherein the step of forming the dopant layer comprises a step of capping the dopant coated on the second III-V semiconductor compound in the S/D regions, with a dielectric material.

15. The method of claim 14, wherein at the step of annealing at a raised temperature the dopant diffuses out of the second III-V semiconductor compound to form the dopant layer above a portion of the channel layer and underlying the source or the drain (S/D) region.

16. A method for forming a semiconductor device comprising steps of:

providing a channel layer of at least one first III-V semiconductor compound above a semiconductor substrate;

forming a gate electrode above a first portion of the channel layer;

forming a source region and a drain region above a second portion of the channel layer, the source region and the drain region comprising a second III-V semiconductor compound; and forming a separate dopant layer of one dopant after forming the source region and the drain region, wherein the dopant layer is above a portion of the channel layer, and directly underlies and contacts the source or the drain (S/D) region, wherein the step of forming the dopant layer comprises steps of:

introducing the dopant into the source and the drain (S/D) regions comprising the second III-V semiconductor compound, wherein the dopant is formed inside the S/D regions through a process selected from the group consisting of an in-situ doping process, an implantation process, and any combination thereof;

depositing a metal layer on or above the S/D regions comprising the second III-V semiconductor compound and the dopant; and annealing the semiconductor device at a raised temperature so as to form a metallic material of the second III-V semiconductor compound in the S/D regions, and drive essentially all the dopant out from the S/D regions to form the separate dopant layer.

17. The method of claim 16, wherein the S/D regions are formed through a process of selective epitaxial growth.

18. The method of claim 17, wherein the dopant is introduced into the S/D regions during the process of selective epitaxial growth.

* * * * *